United States Patent
Chabert et al.

(10) Patent No.: US 10,469,124 B2
(45) Date of Patent: Nov. 5, 2019

(54) COMMUNICATIONS DEVICE WITH RECEIVER CHAIN OF REDUCED SIZE

(71) Applicant: STMicroelectronics SA, Montrouge (FR)

(72) Inventors: Laurent Chabert, Saint Martin d'Heres (FR); Raphael Paulin, Le Versoud (FR)

(73) Assignee: STMicroelectronics SA, Mongrouge (FR)

( * ) Notice: Subject to any disclaimer, the term of this patent is extended or adjusted under 35 U.S.C. 154(b) by 0 days.

(21) Appl. No.: 15/968,927

(22) Filed: May 2, 2018

(65) Prior Publication Data
US 2018/0323821 A1 Nov. 8, 2018

(30) Foreign Application Priority Data
May 5, 2017 (FR) ...................... 17 53996

(51) Int. Cl.
*H04B 1/48* (2006.01)
*H04B 1/16* (2006.01)
(Continued)

(52) U.S. Cl.
CPC ................. *H04B 1/48* (2013.01); *H03F 1/26* (2013.01); *H03F 1/523* (2013.01); *H03F 3/195* (2013.01); *H03F 3/72* (2013.01); *H04B 1/1615* (2013.01); *H04B 1/18* (2013.01); *H03F 2200/06* (2013.01); *H03F 2200/114* (2013.01); *H03F 2200/181* (2013.01); *H03F 2200/222* (2013.01); *H03F 2200/231* (2013.01); *H03F 2200/27* (2013.01); *H03F 2200/294* (2013.01); *H03F 2200/321* (2013.01); *H03F 2200/396* (2013.01); *H03F 2200/451* (2013.01); *H03F 2200/489* (2013.01);
(Continued)

(58) Field of Classification Search
CPC .... H04B 1/48; H04B 1/18; H03F 3/24; H03F 3/195; H03F 1/26; H03F 2200/181; H03F 2200/294; H03F 2200/45; H03F 2200/222; H03F 2200/06; H03F 2200/231
See application file for complete search history.

(56) References Cited

U.S. PATENT DOCUMENTS

| | | | |
|---|---|---|---|
| 2008/0279262 A1* | 11/2008 | Shanjani | H04B 1/48 375/219 |
| 2009/0029654 A1 | 1/2009 | Fu et al. | |

(Continued)

OTHER PUBLICATIONS

Huang, Chun-Wen Paul, et al: "A Highly Integrated Single Chip 5-6 GHz Front-end IC Based on SiGe BiCMOS that Enhances 802.11ac WLAN Radio Front-end Designs," 2015 IEEE Radio Frequency Integrated Circuits Symposium, pp. 227-230.
(Continued)

*Primary Examiner* — Thanh C Le
(74) *Attorney, Agent, or Firm* — Crowe & Dunlevy

(57) ABSTRACT

A communications device includes a transmission chain coupled to an antenna a receiver chain coupled to the antenna. The receiver chain includes an amplifier device having an input coupled to the antenna. A controlled switching circuit is included in the amplifier device and is operable to selectively disconnect conduction terminals of an amplifying transistor from power supply terminals when the transmission chain is operating to pass a transmit signal to the antenna.

16 Claims, 3 Drawing Sheets

(51) Int. Cl.
  *H04B 1/18* (2006.01)
  *H03F 3/195* (2006.01)
  *H03F 1/26* (2006.01)
  *H03F 1/52* (2006.01)
  *H03F 3/72* (2006.01)

(52) U.S. Cl.
  CPC .. *H03F 2200/507* (2013.01); *H03F 2200/519* (2013.01); *H03F 2200/525* (2013.01); *H03F 2200/61* (2013.01); *H03F 2200/75* (2013.01)

(56) References Cited

U.S. PATENT DOCUMENTS

2009/0036065 A1* 2/2009 Siu .................... H03F 3/24
                                                    455/78
2010/0259319 A1  10/2010 Chan et al.
2014/0206301 A1* 7/2014 Geddada ............ H04B 1/44
                                                    455/83
2016/0127005 A1* 5/2016 Nan .................... H04B 1/18
                                                    455/83

OTHER PUBLICATIONS

INPI Search Report and Written Opinion for FR 1753996 dated Jan. 17, 2018 (6 pages).

* cited by examiner

COMMUNICATIONS DEVICE WITH RECEIVER CHAIN OF REDUCED SIZE

PRIORITY CLAIM

This application claims the priority benefit of French Application for Patent No. 1753996, filed on May 5, 2017, the disclosure of which is hereby incorporated by reference in its entirety to the maximum extent allowable by law.

TECHNICAL FIELD

Various embodiments relate to communications devices, in particular for a wireless communication, such as cellular mobile telephones or digital tablets, and notably low-noise amplifier devices, known in the prior art under the acronym LNA, incorporated into the receiver chains of these devices.

BACKGROUND

A communications device generally comprises a transmission chain for a transmit signal and a receiver chain for a receive signal connected to an antenna and to a baseband processing device.

FIG. 1 shows a communications device 1 according to the prior art comprising a transmission chain Tx and a receiver chain Rx connected to an antenna ANT and a baseband processing unit 2, notably a baseband processor.

The transmission chain Tx notably comprises a power amplifier (or PA) device 3 one output of which is connected to the antenna ANT via the source-drain path of a transistor T1. The common node between the amplifier device 3 and the transistor T1 is connected to a ground GND via the source-drain path of a transistor T2. The input of the amplifier device 3 is connected to other conventional and known elements of the transmission chain (not shown here for the sake of simplification of the figure).

The receiver chain Rx comprises an amplifier device 4 commonly denoted by those skilled in the art as a low-noise amplifier (or LNA) one input of which is connected to the antenna ANT via the source-drain path of a transistor T3. The common node between the transistor T3 and the amplifier device 4 is connected to the ground GND via the source-drain path of a transistor T4. The output of the amplifier device 4 is connected to other conventional and known elements of the receiver chain (not shown here for the sake of simplification of the figure).

The amplifier device conventionally comprises at least one amplification transistor T.

The transistors T1, T2, T3 and T4 may be of the same type, for example MOSFET transistors with thick gate oxide, and may be of different dimensions. They are of any given nature, for example NMOS field-effect transistors. The switching circuitry provided by transistors T1, T2, T3 and T4 is controlled by a control circuit incorporated into the baseband processing unit 2.

In a signal transmission mode, the transistors T1 and T4 are conducting, and they behave as parasitic resistances Ron. The transistor T4 provides the grounding of the input of the amplifier device 4. The transistors T2 and T3 are open; they behave as stray capacitances Coff.

In reception mode, the transistors T1 and T4 are open and the transistors T2 and T3 are conducting. The transistor T2 provides the grounding of the output of the amplifier device 3. The transistors T1 and T4 behave as stray capacitances Coff. The transistors T2 and T3 behave as parasitic resistances Ron. The transistor T3 degrades the "Noise Figure" of the amplifier 4.

The quality of the switching device comprising the transistors T1, T2, T3 and T4 is described by the coefficient Coff*Ron. However, this coefficient is fixed for a given technology.

In transmission mode, the amplifier device 3 may, for example, transmit a signal with a power of 33 dBm, i.e. 2 W under a voltage of 10V. The stray capacitance of the transistor T3 allows a stray current to flow which supplies the amplifier device 4. The current coming from the stray capacitance of the transistor T3 can deteriorate the amplification transistor T. Consequently, the switching transistors are dimensioned in such a manner that they channel the parasitic power under a voltage of 10V; they therefore have large dimensions.

Generally speaking, each switching transistor T1, T2, T3 and T4 comprises a set of transistors assembled in series and in parallel in the form of a matrix. This disposition allows a configuration of transistors to be defined, for a given coefficient Ron*Coff, that limits the parasitic effects. The more transistors assembled in the form of a matrix the switching transistor T3 comprises, the more the transistor T3 protects the amplification transistor T.

However, it is desirable to find a compromise between the size of the matrix and a sufficient protection of the amplification transistor T. Indeed, the addition of transistors increases the number of stray capacitances Coff. Moreover, the parasitic resistance Ron of the transistor T3 degrades the noise figure of the low-noise amplifier device in reception mode.

The various elements of the switching circuit are incorporated into the same substrate. They are close to one another. Consequently, substrate and electromagnetic coupling phenomena appear. These phenomena may also degrade the noise figure of the low-noise amplifier device.

There exists a need to improve the noise figure of the low-noise amplifier device and to reduce the space requirement of the switching circuit while at the same time preserving this amplifier device from any deterioration.

SUMMARY

According to embodiments, an improvement in the noise figure of the amplifier device is advantageously provided by incorporating a controllable switching circuit into the amplifier device, the controllable switching circuit being configured for selectively enabling and disabling the amplifier device. Thus, the losses due to the Ron of the transistor T3 contributing to the noise figure of the amplifier device no longer exist. By avoiding this contributor placed in front of the LNA, the noise figure is improved.

According to one aspect, a communications device is provided comprising a transmission chain coupled to an antenna via a first controlled switching circuit, a receiver chain comprising an amplifier device, having an input coupled to the antenna and incorporating a second controlled switching circuit configured for selectively disabling or enabling the amplifier device.

The noise deteriorating the noise figure of the amplifier device generated by the second switching circuit may then be reduced.

According to one embodiment, the amplifier device comprises a first power supply terminal designed to be connected to a first power supply voltage, a second power supply terminal designed to be connected to a second power supply voltage, for example ground, at least one control input designed to receive a control signal and at least one amplification transistor whose control electrode is coupled to the input of the amplifier device, the second switching circuit being coupled to the control input and configured for selectively isolating or otherwise the amplification transistor from the two power supply terminals in response to the control signal.

According to one embodiment, the second switching circuit comprises: a first controlled switching circuit module coupled between a first conduction electrode of the amplification transistor, for example the source, and the second power supply terminal; and a second controlled switching circuit module coupled between a second conduction electrode of the amplification transistor, for example the drain, the first power supply terminal and an output of the amplifier device.

According to one embodiment, each controlled switching circuit module comprises a plurality of switching transistors, the gates of all the switching transistors being connected to one or more distribution rails coupled to the control input.

The amplifier device may comprise at least one amplifier stage, and potentially several amplifier stages.

According to another aspect, an amplifier device is provided incorporated into a communications device such as defined previously.

BRIEF DESCRIPTION OF THE DRAWINGS

Other advantages and features of the invention will become apparent upon examining the detailed description of embodiments, which are in no way limiting, and from the appended drawings in which.

DETAILED DESCRIPTION

Figure 2:
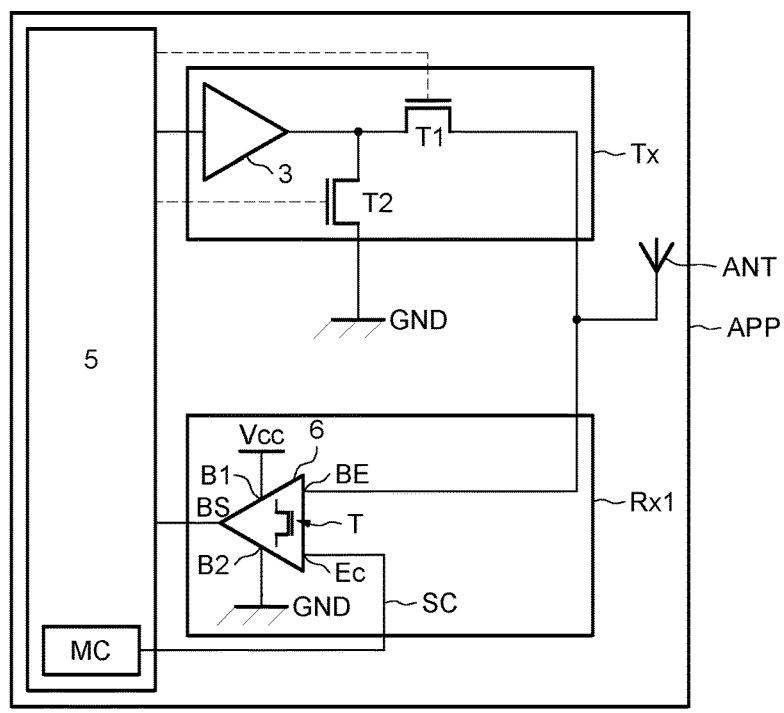
FIG. 2 is a circuit diagram for an embodiment of a communications device.

Reference is made to FIG. 2 which shows one example of an embodiment of a communications device APP.

The communications device APP comprises a transmission chain Tx and a receiver chain Rx1 connected to the antenna ANT and a baseband processing unit 5, notably a baseband processor.

The transmission chain Tx comprises a power amplifier device 3 (or PA) one output of which is connected to the antenna ANT via the source-drain path of a transistor T1. The common node between the amplifier device 3 and the transistor T1 is connected to ground GND via the source-drain path of a transistor T2. The input of the amplifier device 3 is connected to other conventional and known elements of the transmission chain (not shown here for the sake of simplification of the figure).

Figure 1:
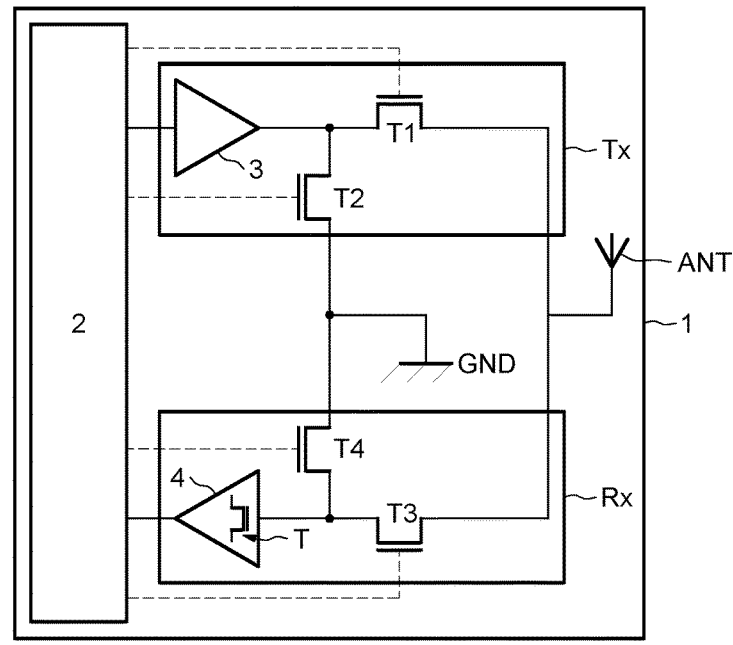
FIG. 1, previously described, illustrates one example of a communications device according to the prior art.

The receiver chain Rx1 comprises a low-noise amplifier device 6 comprising at least one amplification transistor T. In comparison to the implementation of FIG. 1, it will be noted that the circuit no longer comprises the switching transistors T3 and T4 outside of the amplifier device 6.

The low-noise amplifier device 6 comprises an input BE connected to the antenna ANT, a control input Ec and an output BS connected to other conventional and known elements of the receiver chain (not shown here for the sake of simplification of the figure). The device 6 further comprises a first power supply terminal B1 configured to be connected to a first power supply voltage, notably a DC voltage Vcc, and a second power supply terminal B2 configured to be connected to a second power supply voltage, notably ground GND.

The control input Ec of the amplifier device 6 is coupled to a control circuit MC incorporated into the baseband processing unit 5. The control circuit MC is configured to generate a control signal SC.

As a variant, the low-noise amplifier device 6 further comprises one or more power supply terminals designed to be connected to a power supply voltage, notably a DC bias voltage for the amplification transistor T.

Figure 3:
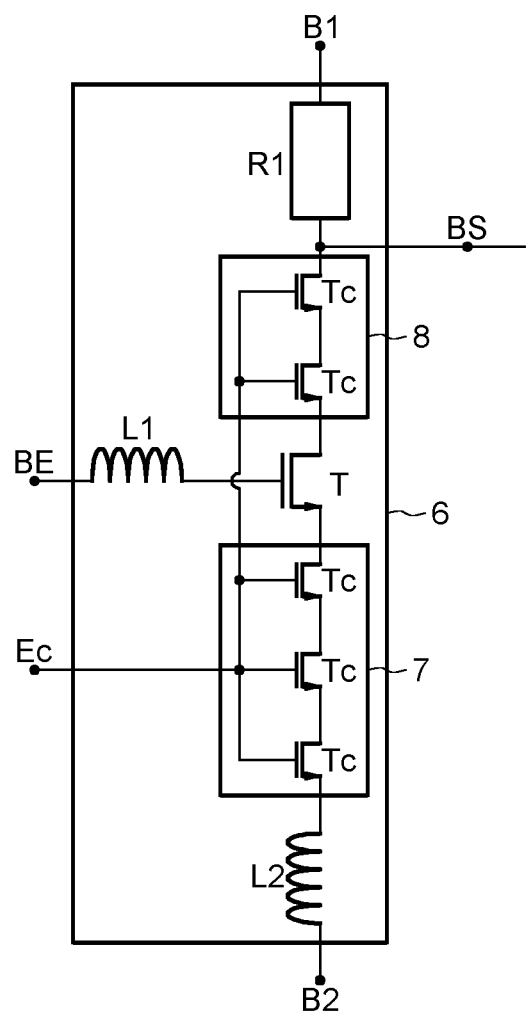
FIG. 3 is a circuit diagram of an amplifier device.

Reference is made to FIG. 3 which shows one example of an embodiment of an amplifier device 6.

In this embodiment, the amplifier device 6 is arranged according to a common source configuration with a band-tailing inductive element L2.

The amplifier device 6 comprises an amplification circuit comprising the amplification transistor T, a first controlled switching circuit module 7 and a second controlled switching circuit module 8, a resistive element R1 and an impedance matching inductive element L1 and a band tailing inductive element L2.

The impedance matching inductive element L1 and the band-tailing inductive element L2 allow the input impedance BE of the amplifier device 6 to be matched in order to optimize the transfer of power between elements connected to the input BE and the transistor T.

The band-tailing inductive element L2 improves the dynamic performance characteristics of the amplification transistor T.

The input impedance matching BE of the amplifier device 6 may be done differently, for example by means of a coupler or of a balanced-unbalanced radiofrequency transformer (known as a "balun").

The controllable switching circuit modules 7 and 8 each comprise a plurality of transistors Tc having source-drain paths connected in series and whose control electrodes are connected to one or more distribution rails comprising resistors, inductors or other devices designed to control the transistors Tc. The distribution rails are connected to the input Ec of the amplifier device 6.

A control of the controllable switching circuit modules 7 and 8 that are independent of each other may be provided. In this case, the amplifier device 6 comprises several control inputs Ec, with one such input controlling the gates of transistors Tc in module 7 and another such input controlling the gates of transistors Tc in module 8.

According to one embodiment, the transistors T and Tc are NMOS transistors.

The gate of the amplification transistor T is connected to the input BE of the amplifier device 6 via the inductive element L1. The source of the transistor T is connected to a first terminal of the inductive element L2 via the first controlled switching circuit module 7. The second terminal of the inductive element L2 is connected to the power supply terminal B2.

The drain of the transistor T is connected to the output BS of the amplifier device 6 via the second controlled switching circuit module 8. The resistive element R1 is connected, on the one hand, to the power supply terminal B1, and on the other, to the output B S.

The transistors Tc are connected in the controllable switching circuit modules 7 and 8 in such a manner that the drain of a transistor Tc is connected to the source of the following transistor. The drain of the transistor Tc situated at the end of the module 7 is connected to the source of the amplification transistor T and the source of the transistor Tc situated at the end of the module 7 is connected to the inductive element L2.

The drain of the transistor Tc situated at the end of the module 8 is connected to the output BS of the amplifier device 6 and the source of the transistor Tc situated at the end of the module 8 is connected to the drain of the amplification transistor T.

In transmission mode, in other words when the transistor T1 is conducting and the transistor T2 is open, the antenna ANT receives a signal produced by the amplifier device 3. This power signal, for example of approximately 33 dBm, or 2 W under a voltage of 10V, is transmitted to the input BE of the amplifier device 6. The transistors Tc are controlled by the control signal SC, in such a manner that the transistors Tc of the switching circuit modules 7 and 8 are opened, which allows the amplifier device 6 to be disabled.

The gate of the transistor T receives the signal produced by the amplifier device 3.

The number of transistors Tc incorporated into each switching circuit module 7 and 8 is determined in such a manner that, in transmission mode, the voltages between, on the one hand, the gate and the source (VGS) of the transistor T and, on the other hand, between the source and the drain (VDS) of the transistor T are lower than a predetermined value which does not damage the transistor T.

Consequently, the transistor T has very low excursions in voltage applied across it which are not able to damage it in a signal transmission mode.

The value of the bias voltage Vcc is generally dependent on the technology of the amplification transistor T. The transistor may for example be formed on a substrate of the Silicon-On-Insulator type, known in the prior art under the acronym SOI, in a 130 nm technology. The resistive element R1 allows the gain of the amplifier device to be determined.

In reception mode, in other words when the transistor T1 is open and the transistor T2 is conducting, the transistors Tc are controlled by the control signal SC in such a manner that the transistors Tc of the switching circuit modules 7 and 8 are conducting, which allows the amplifier device 6 to be enabled. The transistor T is connected to the terminals B1 and B2 and it amplifies the signal received on its gate. The amplified signal is injected at the output S of the amplifier device 6.

Advantageously, the switching transistors Tc are of reduced size. They are connected to the source and to the drain of the amplification transistor T. Since the communication is carried out after the gain of the amplification transistor T, the noise contribution of the switching transistors Tc to the overall noise figure of the receiver chain Rx is lower than that of the transistors T3 and T4 of the prior art situated outside of the amplifier device 4.

The noise figure of the amplifier device 6 is thus improved.

Figure 4:
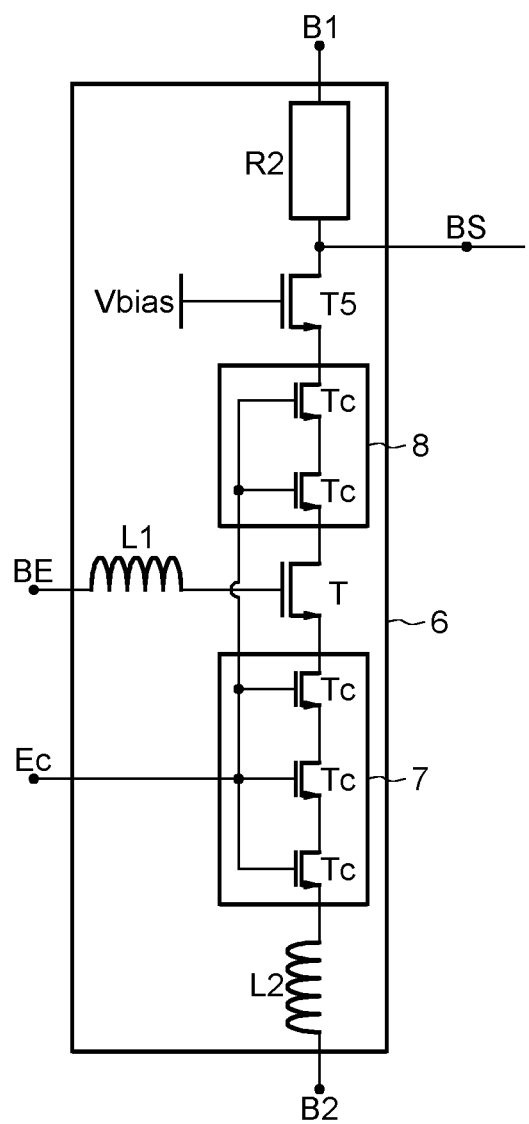
FIG. 4 is a circuit diagram of an amplifier device.

Reference is made to FIG. 4 which shows one example of another embodiment of an amplifier device 6.

In this embodiment, the amplifier device 6 is formed according to a cascoded configuration.

The elements identical to those described in the preceding embodiment are identified by the same numerical references. In this figure can be seen the inductive elements L1 and L2, the amplification transistor T and the controllable switching circuit modules 7 and 8. These elements are arranged as previously described.

The amplifier device 6 further comprises a transistor T5 supplied on its gate by a DC voltage Vbias and a resistive element R2. This resistive element R2 may comprise a complex impedance, notably a high-frequency transformer also known as a coupler or balun.

Here, the transistor T5 is an NMOS transistor.

The drain of the amplification transistor T is connected to the source of the transistor T5 through module 8. The drain of the transistor T5 is connected, on the one hand, to the output S of the amplifier device 6 and, on the other, to a first terminal of the resistive element R2. The second terminal of the resistive element R2 is connected to the power supply terminal B1.

The value of the voltage Vbias is chosen to be higher than the threshold voltage of the transistor T5, generally so as to fix the current consumption of the transistor T5; the transistor T5 is conducting.

In transmission mode, the value of the voltage Vbias is chosen such that the transistor T5 is open; this reinforces the electrical isolation of the transistor T.

Here again, the value of the bias voltage Vcc is generally dependent on the technology of the amplification transistor T. The resistive element R2 allows the gain of the amplifier device 6 to be determined.

Advantageously, the amplifier device according to a cascoded configuration exhibits a compromise between gain, noise, power consumption and isolation that is improved with respect to the non-cascoded amplifier devices.

The embodiment described hereinbefore relates to a low-noise amplifier device comprising a single amplifier stage. The invention is not limited to these embodiments. It would also be possible to provide a low-noise amplifier device comprising several stages of amplification, each comprising an amplification transistor T and means of impedance matching and for polarizing the corresponding amplification transistor T.

The invention claimed is:

1. A communications device, comprising:
a transmission chain coupled to an antenna via first controlled switching circuit;
a receiver chain comprising an amplifier device having an input coupled to the antenna and incorporating a second controlled switching circuit;
wherein the amplifier device comprises:
a first power supply terminal configured to be connected to a first power supply voltage,
a second power supply terminal configured to be connected to a second power supply voltage,
at least one control input configured to receive a control signal, and
at least one amplification transistor having a control electrode that is coupled to the input of the amplifier device;
wherein the second controlled switching circuit operates in response to the control signal received at the control input in a first mode for selectively disabling the amplifier device by isolating the at least one amplification transistor from the first and second power supply terminals and operates in a second mode for selectively enabling the amplifier device.

2. The communications device according to claim 1, wherein the second switching circuit comprises:
a first controllable switching circuit module coupled between a first conduction electrode of the at least one amplification transistor and the second power supply terminal, and
a second controllable switching circuit module coupled between a second conduction electrode of the at least one amplification transistor and both the first power supply terminal and an output of the amplifier device.

3. The communications device according to claim 2, wherein each of the first and second controllable switching circuit modules comprises a plurality of switching transistors, wherein gates of the plurality of switching transistors are connected to one or more distribution rails coupled to the control input.

4. The communications device according to claim 1, wherein the amplifier device comprises at least one amplifier stage.

5. A communications device, comprising:
  a baseband processing circuit having an output, an input and a control circuit;
  a transmission chain coupled between the output of the baseband processing circuit and an antenna;
  a receiver chain comprising an amplifier device having an input coupled to the antenna and an output coupled to the input of the baseband processing circuit;
  wherein the amplifier device comprises:
    an amplification transistor having a control electrode that is coupled to the input of the amplifier device;
    a first controllable switching circuit module coupled between a first conduction electrode of the amplification transistor and a first power supply terminal;
    a second controllable switching circuit module coupled between a second conduction electrode of the amplification transistor and a second power supply terminal;
    wherein the first and second controllable switching circuit modules operate in response to a control signal generated by the control circuit to disconnect the first and second conduction electrodes from the first and second power supply terminals, respectively, when the transmission chain is operating to pass a transmit signal to the antenna.

6. The communications device according to claim 5, wherein the first controllable switching circuit module is further coupled between the first conduction electrode of the amplification transistor and the input of the baseband processing circuit.

7. The communications device according to claim 5, wherein each of the first and second controllable switching circuit modules comprises a plurality of switching transistors, wherein gates of the plurality of switching transistors are coupled to receive the control signal generated by the control circuit.

8. The communications device according to claim 5, wherein the amplifier device is a common source configuration circuit with a band-tailing inductive element.

9. The communications device according to claim 8, wherein the band-tailing inductive element is coupled between the second controllable switching circuit module and the second power supply terminal and a source of the amplification transistor is coupled to an output of the amplifier device through the first controllable switching circuit module.

10. The communications device according to claim 5, wherein the amplifier device is a cascode amplification circuit with a band-tailing inductive element.

11. The communications device according to claim 10, wherein the band-tailing inductive element is coupled between the second controllable switching circuit module and the second power supply terminal and a cascode transistor is coupled between the first controllable switching circuit module and an output of the amplifier device.

12. A communications device, comprising:
  a transmission chain coupled to an antenna via first controlled switching circuit;
  a receiver chain comprising an amplifier device having an input coupled to the antenna;
  a second controlled switching circuit configured to couple the amplifier device to first and second power supply terminals, wherein the second controlled switching circuit operates in response to a control signal to selectively enable operation of the amplifier device by:
    a) isolating the amplifier device from the first and second power supply terminals in a first mode when the first controlled switching element connects the transmission chain to the antenna, and
    b) connecting the amplifier device to the first and second power supply terminals in a second mode when the first controlled switching element disconnects the transmission chain from the antenna.

13. The communications device according to claim 12, wherein the amplifier device comprises:
  a control input configured to receive the control signal; and
  an amplification transistor having a control electrode that is coupled to the input of the amplifier device, said amplification transistor coupled to the first and second power supply terminals through the second controlled switching circuit.

14. The communications device according to claim 13, wherein the second switching circuit comprises:
  a first controllable switching circuit module coupled between a first conduction electrode of the amplification transistor and at least one of the first power supply terminal and an output of the amplifier device; and
  a second controllable switching circuit module coupled between a second conduction electrode of the amplification transistor and the second power supply terminal.

15. The communications device according to claim 14, wherein each of the first and second controllable switching circuit modules comprises a plurality of switching transistors, wherein gates of the plurality of switching transistors are connected to one or more distribution rails coupled to the control input.

16. The communications device according to claim 12, wherein the amplifier device comprises at least one amplifier stage.

* * * * *